United States Patent
Tang et al.

(10) Patent No.: US 6,741,113 B1
(45) Date of Patent: May 25, 2004

(54) MODIFIED HIGH SPEED FLOP DESIGN WITH SELF ADJUSTING, DATA SELECTIVE, EVALUATION WINDOW

(75) Inventors: Bo Tang, Fremont, CA (US); Edgardo F. Klass, Palo Alto, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/356,253

(22) Filed: Jan. 31, 2003

(51) Int. Cl.7 .............................................. H03K 3/356
(52) U.S. Cl. ........................ 327/208; 327/212; 327/218
(58) Field of Search ................................. 327/200, 202, 327/203, 208, 210, 211, 212, 218; 326/94, 95, 96, 97, 98

(56) References Cited

U.S. PATENT DOCUMENTS 6,204,707 B1 * 3/2001 Hamada et al. ............. 327/202
6,437,624 B1 * 8/2002 Kojima et al. .............. 327/211
6,448,829 B1 * 9/2002 Saraf ........................... 327/200

* cited by examiner

Primary Examiner—Tuan T. Lam
(74) Attorney, Agent, or Firm—Gunnison, McKay & Hodgson, L.L.P.; Philip J. McKay

(57) ABSTRACT

Modified high-speed flip-flop include an evaluation window that is self-adjusting and data selective. Consequently, modified high-speed flip-flop circuits designed according to the invention include an evaluation window that can be longer when the data signal is a digital "1" and significantly shorter when the data signal is a digital "0". Therefore, the evaluation window of the modified high-speed flip-flop circuits of the invention selectively varies according to the state of the data signal so there is minimal hold time, increased efficiency and no opportunity for the creation of a racing condition. Consequently, the modified high-speed flip-flops of the invention are more robust and more efficient than prior art flip-flops.

20 Claims, 4 Drawing Sheets

MODIFIED HIGH SPEED FLOP DESIGN WITH SELF ADJUSTING, DATA SELECTIVE, EVALUATION WINDOW

FIELD OF THE INVENTION

The present invention relates generally to logic circuits and, more particularly, to high-speed flip-flop flop circuits and designs.

BACKGROUND OF THE INVENTION

FIG. 1A shows a schematic diagram of one embodiment of a typical prior art flip-flop circuit 100. As seen in FIG. 1A, prior art flip-flop circuit 100 included the significant elements: delay portion 101 with delay output terminal 113 carrying the signal L1_CLKd 121, also referred to herein as CLKd 121; first node 103; clock input terminal 102 coupled to signal L1_CLK 111, also referred to herein as CLK 111; data input terminal 104 coupled to data signal 107; second node 115 carrying signal end 125; second supply voltage 109, also referred to herein as ground 109; third node 114 carrying the signal OUT_n 123; and output terminal 116 carrying the signal output signal q_1 127.

As also seen in FIG.1A, prior art flip-flop circuit 100 included delay portion 101 incorporated in prior art flip-flop circuit 100 to delay the incoming signal CLK 111 to ensure that a sufficient time was allowed for first node 103 to discharge to ground 109, through path 105, when the data signal 107 was a digital "1". If this delay time was not sufficient, a racing condition could develop and the operation of prior art flip-flop circuit 100 would be impaired and/or functional failure of prior art flip-flop circuit 100 could result. Consequently, in the prior art, designers had to be extremely careful to ensure the delay time, also called the evaluation "window" provided by delay portion 101 was sufficient. However, a larger evaluation window resulted in longer hold times that may cause function error at the block level. Consequently, there was an inherent conflict between obtaining the minimum hold-time of operation for prior art flip-flop circuit 100 and providing a comfortable window to ensure proper operation of prior art flip-flop circuit 100.

In the prior art, the evaluation window or delay time of prior art flip-flop circuit 100 was identical and constant, regardless of the data input. This is seen in FIG. 1A by the fact that delay portion 101 is simply a two inverter delay of signal CLK 111, regardless of the state of the data signal 107. This feature of prior art flip-flop circuit 100 is also shown in FIG. 1B. FIG. 1B is a typical timing diagram for a prior art flip-flop, such as prior art flip-flop circuit 100. Shown in FIG. 1B are: the signal L1_CLK 111, also referred to herein as CLK 111, on clock input terminal 102 in FIG. 1A; data signal 107 on data input terminal 104 in FIG. 1A; the signal L1_CLKd 121, also referred to herein as CLKd 121, on delay output terminal 113 in FIG. 1A; the signal OUT_n 123 on third node 114 in FIG. 1A; the signal end 125 on second node 115 in FIG. 1A; and output signal q_1 127 on output terminal 116 in FIG. 1A.

As shown in FIG. 1B, and discussed above, there existed delays or evaluation windows, i.e., windows 131, 141, 151, 161, 171 and 181 in FIG. 1B, between the fifty percent of the rising edge of the signal L1_CLK 111, i.e., points 133, 143, 153, 163, 173 and 183 in FIG. 1B, and fifty percent of the rising edge of the signal L1_CLKd 121, i.e., points 135, 145, 155, 165, 175, and 185 in FIG. 1B. Significantly, as shown in FIG. 1B, windows 131, 141, 151, 161, 171 and 181 were all of approximately equal duration, regardless of the state, i.e., high or low, of data signal 107. Therefore, windows 141, 151 and 181, when data signal 107 was high, were of approximately equal size as windows 161 and 171, when data signal 107 was low The fact that evaluation windows 131, 141, 151, 161, 171 and 181 of prior art flip-flop circuit 100 were all of approximately equal duration, regardless of the state of data signal 107, was inefficient because when data signal 107 was high, or a digital "1" a long evaluation widow was required to delay signal CLK 111 so, as discussed above with respect to FIG. 1A, node 103 could discharge to ground 109 before the next clock. However, when data signal 107 was low, or a digital "0", there is no need for a long evaluation window because node 103 does not discharge to ground 109 and therefore there is no need of the window to delay signal CLK 111. Consequently, in the prior art, evaluation windows 161 and 171 were unnecessarily large when the data signal 107 was a digital "0". This, in turn, resulted in unnecessarily long hold times and inherent internal margins for prior art flip-flops such as prior art flip-flop circuit 100.

In addition, since, in the prior art, evaluation windows 131, 141, 151, 161, 171 and 181 were all of approximately equal duration, regardless of the state of data signal 107, there was an inherent, and static, internal margin. Consequently, when a circuit designer was modifying a prior art system incorporating prior art flip-flops, for instance in the event of a scaling or "shrink" to a new generation, the designer would have to redesign each circuit and modify the layouts to ensure proper prior art flip-flop operation and that the internal margins were still satisfied. This was a huge effort and was an unfortunate waste of considerable time and resources that served to undermine the advantages inherent in the shrinking process.

Also, since, in the prior art, evaluation windows 131, 141, 151, 161, 171 and 181 were all of approximately equal duration, regardless of the state of data signal 107, evaluation windows 131, 141, 151, 161, 171 and 181 had to be large enough to accommodate the greatest possible number of operational parameters, i.e., prior art flip-flops, like any circuit, had to be designed to be flexible enough to operate in all, or most, technical corners anticipated. Since, in the prior art, evaluation windows 131, 141, 151, 161, 171 and 181 were all of approximately equal duration, this meant the entire system had to be designed with evaluation windows 131, 141, 151, 161, 171 and 181 large enough to accommodate the worst case. This, of course, was far from efficient and resulted in unnecessarily long hold times and unnecessary delay elements in the block which wastes very limited, and precious, chip space.

In addition, since, in the prior art, evaluation windows 131, 141, 151, 161, 171 and 181 were all of approximately equal duration, regardless of the state of data signal 107, and there was an inherent internal margin, prior art flip-flops were often not operational at ultra low supply voltages. In an electronics industry that stresses portability, prolonged battery function and minimization of heat generation, this was a significant limitation.

What is needed is a method and apparatus for creating a modified high-speed flip-flop that is capable of adjusting the delay time, or evaluation window, to accommodate the state of the data signal, thereby minimizing the hold time and eliminating the internal margin.

SUMMARY OF THE INVENTION

The present invention is directed to a method and apparatus for creating a modified high-speed flip-flop including a data selective adjustable evaluation window, thereby eliminating the internal margin.

According to the present invention, the evaluation window or delay time of the modified high-speed flip-flop circuits of the invention are self-adjusting and data selective. Consequently, the evaluation window is longer when the data signal is a digital "1" and significantly shorter when the data signal is a digital "0". Therefore, the evaluation windows of the modified high-speed flip-flop circuits of the invention are variable so there is minimal hold time, increased efficiency and no opportunity for the creation of a racing condition. Consequently, the modified high-speed flip-flops of the invention are more robust than prior art flip-flops.

Since, according to the invention, the evaluation window is adjustable and data selective, there is no inherent internal margin. Consequently, when a circuit designer wishes to modify a system incorporating the modified high-speed flip-flop circuits of the invention, for instance in the event of a scaling or "shrink" to a new generation, the designer can do so without the need to redesign each circuit and modify the layouts to ensure proper flip-flop operation. Thus, the modified high-speed flip-flop circuits of the invention are readily scalable and the huge effort and waste of time and resources required with prior art designs is completely avoided.

Also, since, according to the invention, the evaluation window is adjustable, and data selective, the evaluation window need not be large enough to accommodate the greatest possible number of operational parameters, i.e., the modified high-speed flip-flop circuits of the invention, with their adjustable evaluation window, are flexible enough to be adjusted to operate in all, or most, technical corners on a case by case basis. This means that, in contrast to the prior art designs, the entire system need not be designed with an evaluation window large enough to accommodate the worst case. Consequently, the modified high-speed flip-flop circuits of the invention are far more efficient, have shorter hold times and more robust than prior art flip-flops.

In addition, since, according to the invention, the evaluation window is adjustable and data selective and there is no inherent internal margin, the modified high-speed flip-flop circuits of the invention can be made operational at ultra low supply voltages. As noted above, in an electronics industry that stresses portability, prolonged battery function and minimization of heat generation, this is a significant advantage.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings.

DETAILED DESCRIPTION

Figure 1A:
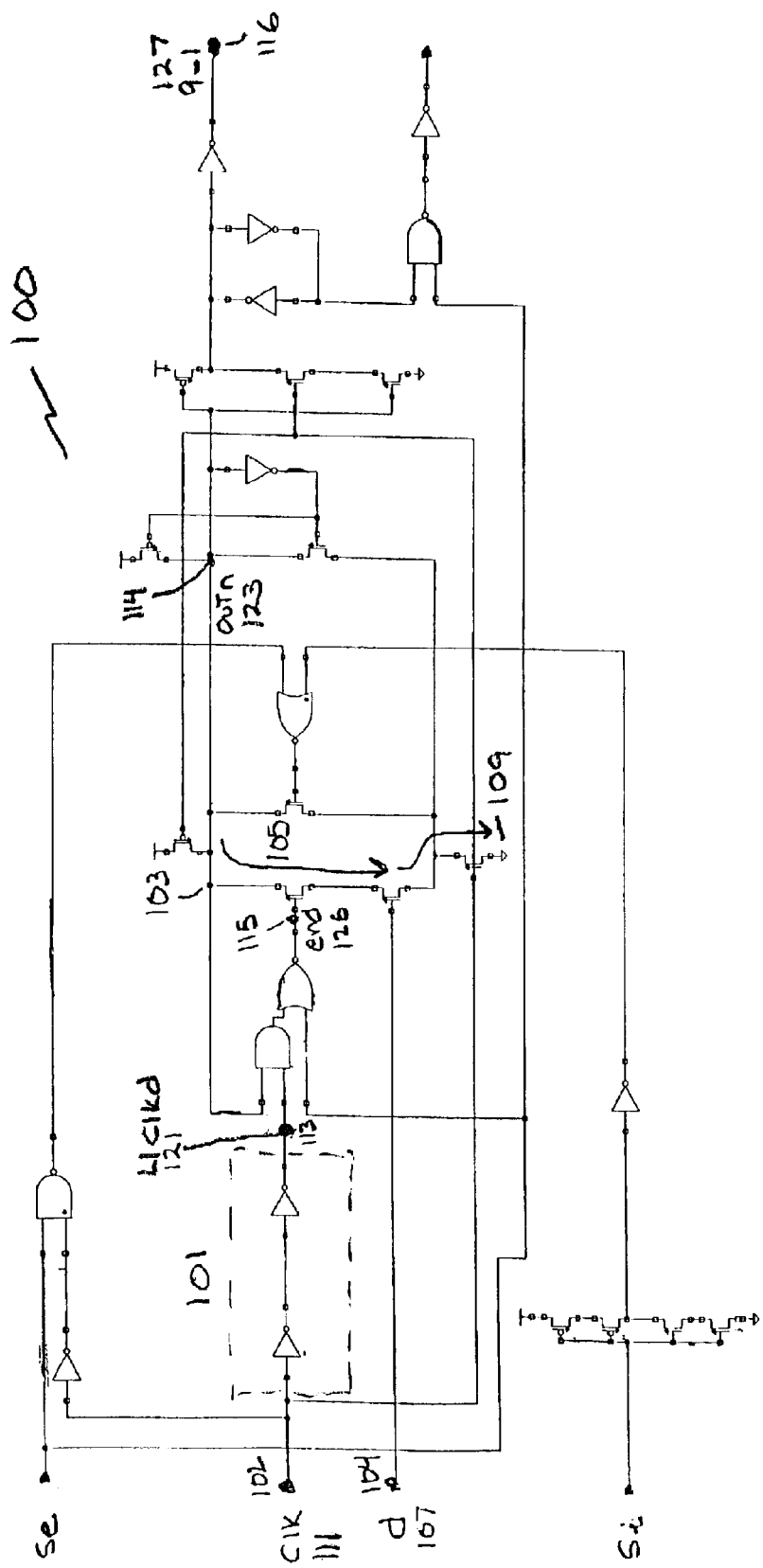
FIG. 1A shows a schematic diagram of a prior art flip-flop circuit.

The invention will now be described in reference to the accompanying drawings. The same reference numbers may be used throughout the drawings and the following description to refer to the same or like parts.

According to the present invention, the evaluation window or delay time (251, 261 and 271 in FIG. 2A) of the modified high-speed flip-flop circuits of the invention is self-adjusting and data selective. Consequently, the evaluation window (251 in FIG. 2A) is longer when the data signal (207 in FIG. 2A) is a digital "1", that transitions to a digital "0" at a later time (time 253 in FIG. 2A) or "infinitely" long when the data signal is a digital "1" and remains a digital "1" in this cycle (time 241 in FIG. 2A), and significantly shorter when the data signal is a digital "0" (times 263 and 273 in FIG. 2A). Therefore, the evaluation window of the modified high-speed flip-flop circuits of the invention is variable so there is minimal hold time, increased efficiency and no opportunity for the creation of a racing condition. Consequently, the modified high-speed flip-flop circuits of the invention are more robust and more efficient than prior art flip-flops.

Since, according to the invention, the evaluation window is adjustable and data selective, there is no inherent internal margin. Consequently, when a circuit designer wishes to modify a system incorporating the modified high-speed flip-flop of the invention, for instance in the event of a scaling or "shrink" to a new generation, the designer can do so without the need to redesign each circuit and modify the layouts to ensure that the internal margins are still satisfied. Thus, the modified high-speed flip-flop circuits of the invention are readily scalable and the huge effort and waste of time and resources required to scale prior art designs is completely avoided.

Also, since, according to the invention, the evaluation window is adjustable and data selective, the evaluation window need not be large enough to accommodate the greatest possible number of operational parameters, i.e., the modified high-speed flip-flop circuits of the invention with their adjustable evaluation windows are flexible enough to adjusted to operate in all, or most, technical corners on a case by case basis. This means that, in contrast to the prior art designs, the entire system need not be designed with an evaluation window large enough to accommodate the worst case. Consequently, the modified high-speed flip-flop circuits of the invention are far more efficient, have shorter hold times and more robust than prior art flip-flops.

In addition, since, according to the invention, the evaluation window is adjustable and data selective, and there is no inherent internal margin, modified high-speed flip-flop circuits of the invention can be made operational at ultra low supply voltages. In an electronics industry that stresses portability, prolonged battery function and minimization of heat generation, this is a significant advantage.

Figure 2A:
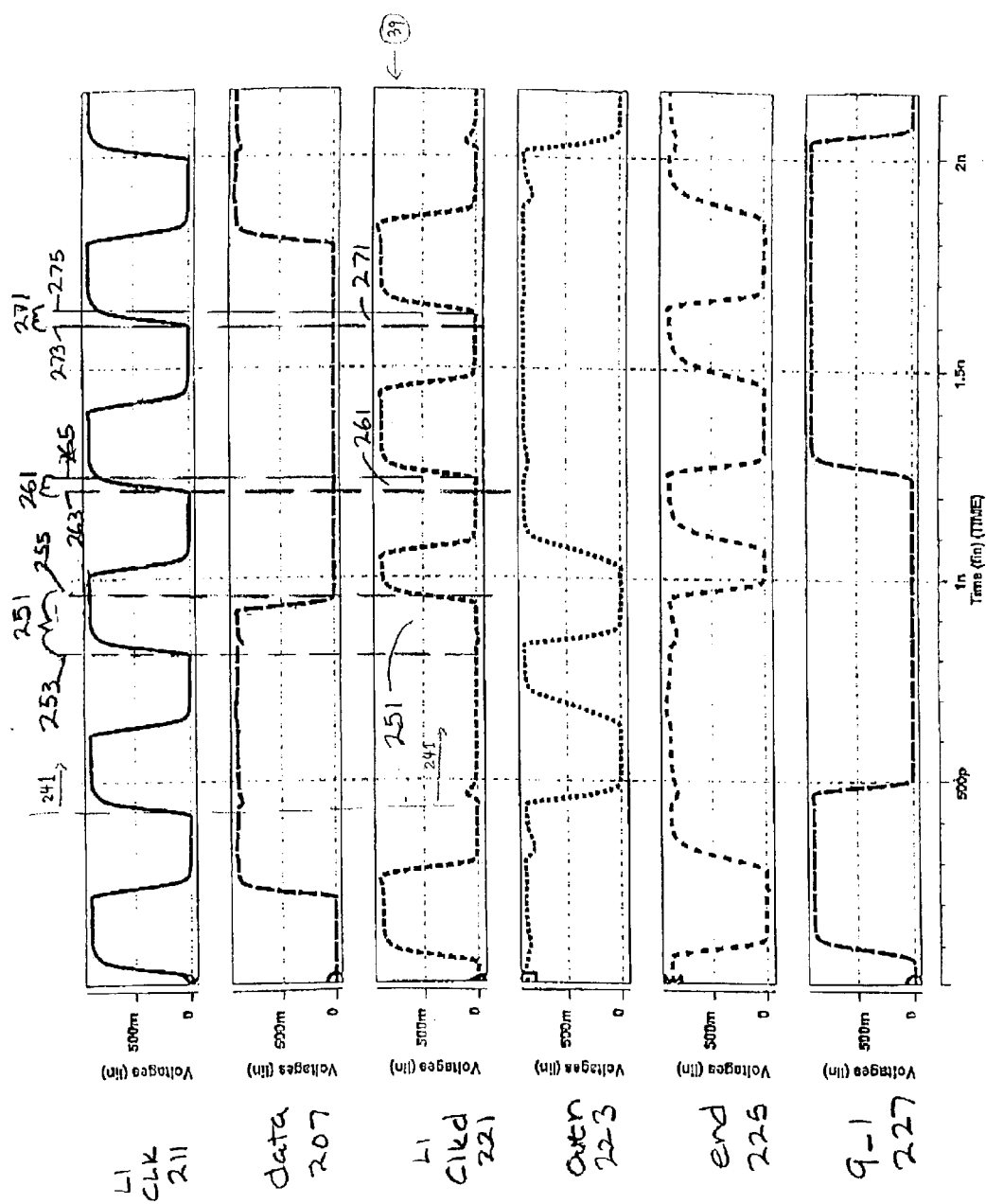
FIG. 2A is a one embodiment of a timing diagram for modified high-speed flip-flop circuits designed according to the principles of the present invention.

FIG. 2A is a typical timing diagram for a modified high-speed flip-flop circuit designed in accordance with the principles of the invention. For exemplary purposes only, the timing diagram in FIG. 2B will be discussed below with references to the modified high-speed flip-flop circuit 200 shown FIG. 2B, and discussed in more detail below. However, those of skill in the art will readily recognize that the one embodiment of a modified high-speed flip-flop circuit shown in FIG. 2A is merely one example of an implementation of the present invention. Those of skill in the art will also recognize that numerous types of modified high-speed flip-flop circuits, employing various numbers and types of components, could be used to effect the same result and the substantially the same timing diagram as shown in FIG. 2A. Therefore, the present invention should not be construed as being limited to the one exemplary embodiment of a modified high-speed flip-flop circuit designed according to the invention shown in FIG. 2A.

Shown in FIG. 2A are: the signal L1_CLK 211, also referred to herein as CLK 211; data signal 207; the signal L1_CLKd 221, also referred to herein as CLKd 221; the signal OUT_n 223; the signal end 225; and output signal q_1 227

As shown in FIG. 2A, there are delays or evaluation windows 241, 251, 261, and 271 between fifty percent of the rising edge of the signal L1_CLK 211, i.e., points 253, 263 and 273 in FIG. 2A, and fifty percent of the rising edge of the signal L1_CLKd 221, i.e., points 255, 255 and 275 in FIG. 2A. Significantly, as shown in FIG. 2A, window 251 can be larger, or a longer time period, than windows 261 or 271. According to the invention, window 251 can be larger because data signal 207 is a digital "1" at time 253 as signal CLK 211 is going high. Consequently, window 251 can be larger, or a longer time period to allow a node, such as node 203 in FIG. 2B, to discharge from a digital "1" to a digital "0" before signal CLKd switches to a digital "1", i.e., the end node 225 in FIG. 2B transitions to a digital "0" to shut off the discharge path 247 in FIG. 2B. However, according to the present invention, windows 261 and 271 are much smaller than windows 241, 251, i.e., a much shorter time period, because data signal 207 is a digital "0" at time 263 as signal CLK 211 is going high and at time 273 as signal CLK 211 is again going high.

As shown in FIG. 2A, according to the present invention, the evaluation window (241, 251, 261 and 271 in FIG. 2A) of the modified high-speed flip-flop circuits of the invention is self-adjusting and data selective and evaluation windows 241, 251 is longer when data signal 207 is a digital "1" and significantly shorter, when the data signal is a digital "0". Therefore, the evaluation window 241, 251, 261 and 271 of the modified high-speed flip-flop circuits of the invention is variable so there is minimal hold time, increased efficiency and no opportunity for the creation of a racing condition. Consequently, the modified high-speed flip-flop circuits of the invention are more robust and more efficient than prior art flip-flops.

Figure 1B:
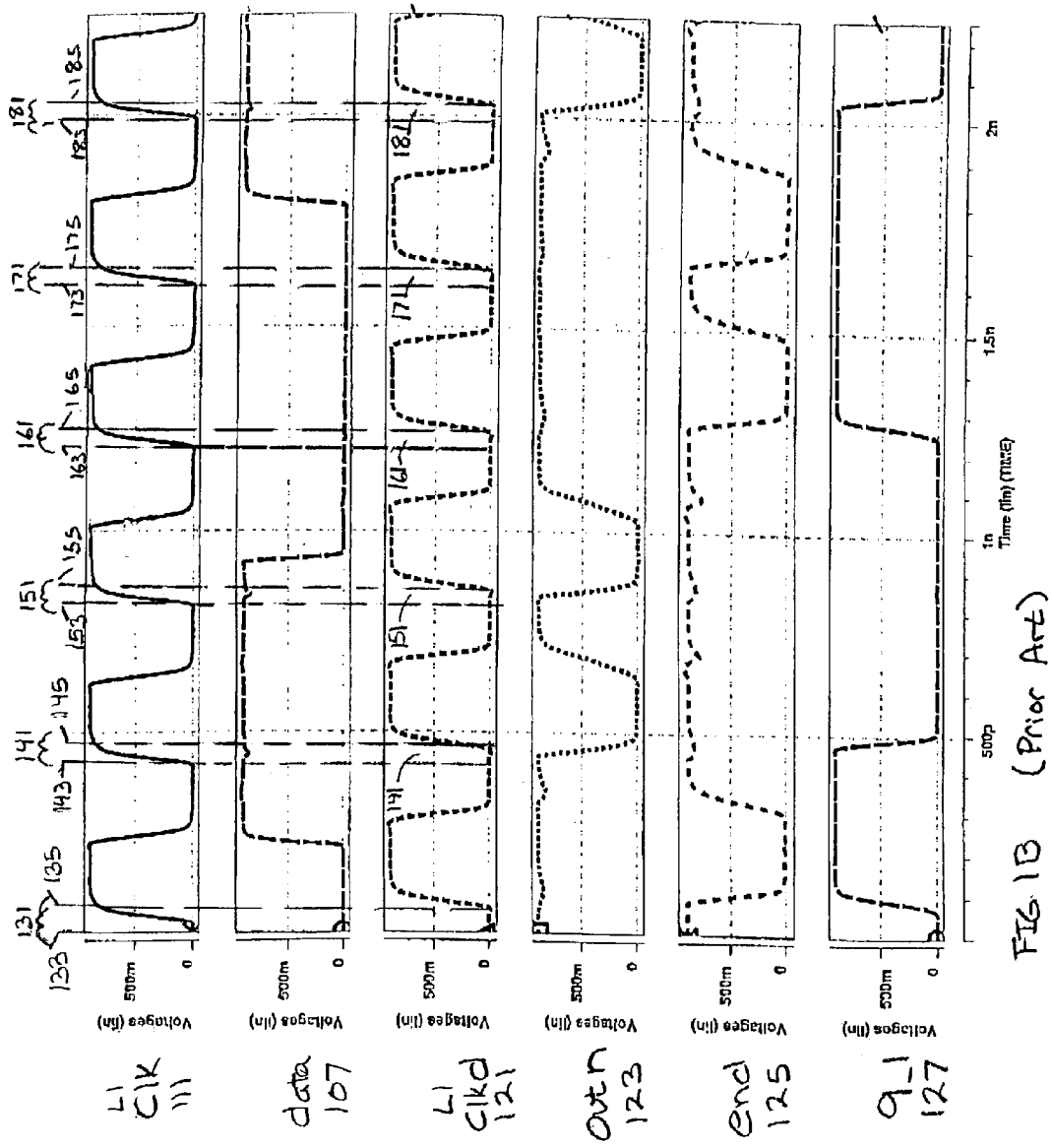
FIG. 1B is a typical timing diagram for a prior art flip-flop circuit such as is shown in FIG. 1A.

Also of significance is the fact that, according to the invention, the signal OUT_n 223; and output signal q_1 227 remain the same as the prior art signal OUT_n 123; and prior art output signal q_1 127, respectively, shown in FIG. 1B. Consequently, the present invention can be incorporated into existing systems and structures with little or no logic modifications or significant change or redesign of system parameters.

As discussed above, since, according to the invention, evaluation windows 241, 251, 261 and 271 are adjustable and data selective, there is no inherent internal margin. Consequently, when a circuit designer wishes to modify a system incorporating the modified high-speed flip-flop circuits of the invention, for instance in the event of a scaling or "shrink" to a new generation, the designer can do so without the need to redesign each circuit and modify the layouts to ensure that the internal margins are still satisfied. Thus, the modified high-speed flip-flops of the invention are readily scalable and the huge effort and waste of time and resources required to scale prior art designs is completely avoided.

As also discussed above, since, according to the invention, evaluation windows 241, 251, 261 and 271 are adjustable and data selective, evaluation windows 241, 251, 261 and 271 need not be large enough to accommodate the greatest possible number of operational parameters, i.e., the modified high-speed flip-flop circuits of the invention with their adjustable evaluation windows 241, 251, 261 and 271 are flexible enough to be adjusted to operate in all, or most, technical corners on a case by case basis. This means that, in contrast to the prior art designs, the entire system need not be designed with an evaluation window large enough to accommodate the worst case. Consequently, the modified high-speed flip-flop circuits of the invention are far more efficient, have shorter hold times and more robust than prior art flip-flops.

In addition, since, according to the invention, evaluation windows 241, 251, 261 and 271 are adjustable and data selective, and there is no inherent internal margin, modified high-speed flip-flop circuits of the invention can be made fully operational at ultra low supply voltages.

Figure 2B:
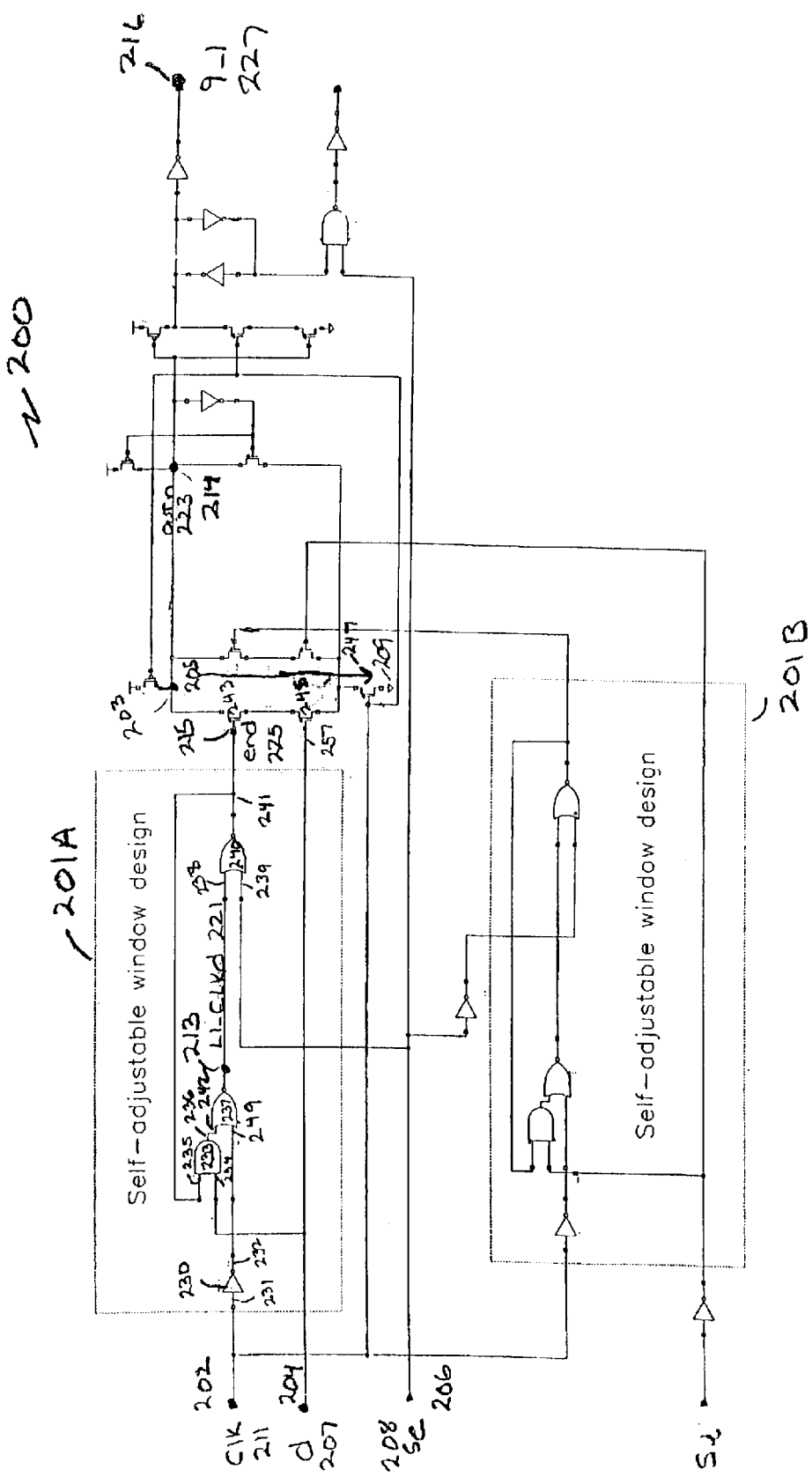
FIG. 2B shows a schematic diagram of one embodiment of a modified high-speed flip-flop circuit designed according to the principles of the present invention.

FIG. 2B shows a schematic diagram of one embodiment of a modified high-speed flip-flop circuit 200 designed according to the principles of the present invention. As seen in FIG. 2B, modified high speed flip-flop circuit 200 includes: self adjusting window circuit 201A; self adjusting window circuit 201B; self adjusting window delay terminal 213, carrying the signal L1_CLKd 221, also referred to herein as CLKd 221; first node 203; clock input terminal 202, coupled to signal L1_CLK 211, also referred to herein as CLK 211; data input terminal 204, coupled to data signal 207; second node 225 carrying the signal end 225; second supply voltage 209, also referred to herein as ground 209; third node 214 carrying the signal OUT_n 223; and output terminal 226 carrying signal output signal q_1 227.

As discussed above, and as seen in FIG. 2B, modified high speed flip-flop circuit 200 includes self adjusting window circuit 201A and self adjusting window circuit 201B to delay incoming signal CLK 211, according to the invention, as needed, to ensure that a sufficient time is allowed for first node 203 to discharge to ground 209, through path 205, when the data signal 207 is a digital "1".

As discussed above, the delay time provided by self-adjusting window circuit 201A or self-adjusting window circuit 201B must be sufficient, and, according to the invention, provided at the correct time, to ensure the proper operation of modified high-speed flip-flop circuit 200. As also noted above, in the prior art, there was an inherent conflict between obtaining the minimum hold-time of operation for a high-speed flip-flop and providing a comfortable window to ensure proper operation of the high-speed flip-flop circuit.

In operation, clock input terminal 202 receives signal CLK 211 and data terminal 204 receives data signal 207. In addition, a signal scan enable 208, also called signal SE 208, is coupled to input 206. Signal scan enable determines when self adjusting window circuit 201A is activated and when self adjusting window circuit 201B is activated. When signal SE 208 is a digital "0", or low, self adjusting window circuit 201A is activated. When signal SE 208 is a digital "1", or high, self adjusting window circuit 201B is activated. In the following discussion, it will be assumed signal SE 208 is a digital "0", or low, and self adjusting window circuit 201A is activated. However, those of skill in the art will recognize that when signal SE 208 is a high, and self adjusting window circuit 201B is activated, the operation of modified flip-flop circuit 200 would be substantially the same as discussed below except for the fact that self adjusting window circuit 201B would be employed instead of self adjusting window circuit 201A.

As discussed above, for the following discussion it is assumed that scan is not enabled, i.e., signal SE 208 is low. In addition, node 215 is initially pre-charged to high. When signal CLK 211 transitions to high and data signal 207 is high, input terminal 231 of first inverter 230 is high and output terminal 232 of first inverter 230 is low so that input terminal 249 of NOR gate 237 is low. Input terminal 234 of AND gate 233 is high and input terminal 235 of AND gate 233 is high so that output terminal 236 of AND gate 233 is high. In turn, input terminal 242 of NOR gate 237 is high and signal L1_CLKd 221 is low so that input terminal 238 of NOR gate 240 is low and signal end 225 at node 215 is high. As a result, transistors 243 and 247 are on. In addition, according to the invention, gate 257 of transistor 245 is coupled to data terminal 204 and data signal 207. Consequently, when data signal 207 is high, transistor 245 is also on so that path 205 from node 203 to ground 209 is opened and node 203 can discharge to ground 209 so that signal OUT_n 223 at node 214 is low while the data is high. Consequently, according to the invention the state of the data signal 207 itself, i.e., a high data signal 207, results in keeping path 205 open, thereby creating a relatively large evaluation window when data signal 207 is high and allowing node 209 to discharge.

When signal CLK 211 transitions to high and data signal 207 is low, input terminal 231 of first inverter 230 is high and output terminal 232 of first inverter 230 is low, as is input terminal 249 of NOR gate 237. Input terminal 234 of AND gate 233 is low and input terminal 235 of AND gate 233 is initially high so that output terminal 236 of AND gate 233 is low. In turn, input terminal 242 of NOR gate 237 is low and signal L1_CLKd 221 is high so that input terminal 238 of NOR gate 240 is high and signal end 225 at node 215 is low. In addition, node 241 is low and serves to first change the input on input terminal 235 of AND gate 233 low and then serves as a keeper to hold the input on input terminal 235 of AND gate 233 low, thereby holding signal end 225 low, even if data signal 207 switches high. As a result, transistor 243 is off and transistor 247 is on and path 205 from node 203 to ground 209 is closed so that signal OUT_n 223 on node 214 is high and the evaluation window when data signal 207 is low can be designed to be minimal.

Those of skill in the art will readily recognize that the one embodiment of a modified high-speed flip-flop circuit shown in FIG. 2B is merely one example of an implementation of the present invention. Those of skill in the art will also recognize that numerous types of modified high-speed flip-flop circuits, employing various numbers and types of components, could be used to effect the same result, i.e., the evaluation window or delay time of the modified high-speed flip-flop circuit of the invention is self-adjusting and data selective. Therefore, the present invention should not be construed as being limited to the one exemplary embodiment of a modified high-speed flip-flop circuit designed according to the invention shown in FIG. 2B.

The foregoing description of an implementation of the invention has been presented for purposes of illustration and description only, and therefore is not exhaustive and does not limit the invention to the precise form disclosed. Modifications and variations are possible in light of the above teachings or may be acquired from practicing the invention.

For example, as discussed above, for illustrative purposes specific embodiments of the invention were shown with specific components and timing. However, Those of skill in the art will readily recognize that the embodiments of a modified high-speed flip-flop circuit shown in the FIGS. are merely one example of implementations of the present invention. Those of skill in the art will also recognize that numerous types of modified high-speed flip-flop circuits, employing various numbers and types of components, could be used to effect the same result, i.e., the evaluation window or delay time of the modified high-speed flip-flop circuit of the invention is self-adjusting and data selective. Therefore, the present invention should not be construed as being limited to the exemplary embodiments of a modified high-speed flip-flop circuit designed according to the invention shown in the FIGS.

In addition, FIG. 2B is a typical timing diagram for a modified high-speed flip-flop circuit designed in accordance with the principles of the invention. For exemplary purposes only, the timing diagram in FIG. 2B is shown with specific window sizes and specific signals. However, those of skill in the art will readily recognize that the one embodiment of a modified high-speed flip-flop circuit timing diagram shown in FIG. 2B is merely one example of an implementation of the present invention. Those of skill in the art will also recognize that numerous types of flip-flop circuits, employing various numbers and types of components, could be used to effect the same result and the substantially the same timing diagram as shown in FIG. 2B.

Consequently, the scope of the invention is defined by the claims and their equivalents.

What is claimed is:

1. A method for providing a modified high-speed flip-flop circuit comprising:
   providing a flip-flop circuit;
   providing a first clock signal to the flip-flop circuit;
   providing a data signal to the flip-flop circuit, the data signal having a high state and a low state; and
   providing a delayed clock signal to the flip-flop circuit such that an evaluation window exists between a rising edge of the first clock signal and a rising edge of the delayed clock signal, wherein;
   the duration of evaluation window between the rising edge of the first clock signal and the rising edge of the delayed clock signal is adjustable.

2. The method for providing a modified high-speed flip-flop circuit of claim 1, wherein;
   the duration of evaluation window between the rising edge of the first clock signal and the rising edge of the delayed clock signal is adjustable based on the state of the data signal.

3. The method for providing a modified high-speed flip-flop circuit of claim 1, wherein;
   the duration of evaluation window between the rising edge of the first clock signal and the rising edge of the delayed clock signal is a first value when the data signal is in the high state; and
   the duration of evaluation window between the rising edge of the first clock signal and the rising edge of the delayed clock signal is a second value, different from the first value, when the data signal is in the low state.

4. The method for providing a modified high-speed flip-flop circuit of claim 3 further wherein:
   the first value of the duration of evaluation window between the rising edge of the first clock signal and the rising edge of the delayed clock signal is adjustable to be larger than the second value of the duration of evaluation window between the rising edge of the first clock signal and the rising edge of the delayed clock signal.

5. The method for providing a modified high-speed flip-flop circuit of claim 1, further comprising:

providing a self adjusting window circuit coupled to the first clock signal for generating the delayed clock signal such that;

the duration of evaluation window between the rising edge of the first clock signal and the rising edge of the delayed clock signal is adjustable.

6. The method for providing a modified high-speed flip-flop circuit of claim 5, wherein;

the duration of evaluation window between the rising edge of the first clock signal and the rising edge of the delayed clock signal is adjustable based on the state of the data signal.

7. The method for providing a modified high-speed flip-flop circuit of claim 1, further comprising:

providing a self adjusting window circuit coupled to the first clock signal for generating the delayed clock signal such that;

the duration of evaluation window between the rising edge of the first clock signal and the rising edge of the delayed clock signal is a first value when the data signal is in the high state; and the duration of evaluation window between the rising edge of the first clock signal and the rising edge of the delayed clock signal is a second value, different from the first value, when the data signal is in the low state.

8. The method for providing a modified high-speed flip-flop circuit of claim 7 further wherein:

the self adjusting window circuit is coupled to the first clock signal such that the first value of the duration of evaluation window between the rising edge of the first clock signal and the rising edge of the delayed clock signal is larger than the second value of the duration of evaluation window between the rising edge of the first clock signal and the rising edge of the delayed clock signal.

9. A modified high-speed flip-flop circuit comprising:

a flip-flop circuit;

a first clock signal coupled to the flip-flop circuit;

a data signal coupled to the flip-flop circuit, the data signal having a high state and a low state; and a delayed clock signal coupled to the flip-flop circuit such that an evaluation window exists between a rising edge of the first clock signal and a rising edge of the delayed clock signal, wherein;

the duration of evaluation window between the rising edge of the first clock signal and the rising edge of the delayed clock signal is adjustable.

10. The modified high-speed flip-flop circuit of claim 9, wherein;

the duration of evaluation window between the rising edge of the first clock signal and the rising edge of the delayed clock signal is adjustable based on the state of the data signal.

11. The modified high-speed flip-flop circuit of claim 9, wherein;

the duration of evaluation window between the rising edge of the first clock signal and the rising edge of the delayed clock signal is a first value when the data signal is in the high state; and the duration of evaluation window between the rising edge of the first clock signal and the rising edge of the delayed clock signal is a second value, different from the first value, when the data signal is in the low state.

12. The modified high-speed flip-flop circuit of claim 11, further wherein:

the first value of the duration of evaluation window between the rising edge of the first clock signal and the rising edge of the delayed clock signal adjustable to be larger than the second value of the duration of evaluation window between the rising edge of the first clock signal and the rising edge of the delayed clock signal.

13. The modified high-speed flip-flop circuit of claim 9 further comprising:

a self adjusting window circuit coupled to the first clock signal for generating the delayed clock signal such that;

the duration of evaluation window between the rising edge of the first clock signal and the rising edge of the delayed clock signal is adjustable.

14. The modified high-speed flip-flop circuit of claim 13, wherein;

the duration of evaluation window between the rising edge of the first clock signal and the rising edge of the delayed clock signal is adjustable based on the state of the data signal.

15. The modified high-speed flip-flop circuit of claim 9 further comprising:

a self adjusting window circuit coupled to the first clock signal, the self adjusting window circuit for generating the delayed clock signal such that;

the duration of evaluation window between the rising edge of the first clock signal and the rising edge of the delayed clock signal is a first value when the data signal is in the high state; and the duration of evaluation window between the rising edge of the first clock signal and the rising edge of the delayed clock signal is a second value, different from the first value, when the data signal is in the low state.

16. The modified high-speed flip-flop circuit of claim 15 further wherein:

the self adjusting window circuit is coupled to the first clock signal such that the first value of the duration of evaluation window between the rising edge of the first clock signal and the rising edge of the delayed clock signal adjustable to be larger than the second value of the duration of evaluation window between the rising edge of the first clock signal and the rising edge of the delayed clock signal.

17. A method for providing a modified high-speed flip-flop circuit comprising:

providing a flip-flop circuit;

providing a first clock signal to the flip-flop circuit;

providing a data signal to the flip-flop circuit, the data signal having a high state and a low state; and providing a delayed clock signal to the flip-flop circuit such that an evaluation window exists between a rising edge of the first clock signal and a rising edge of the delayed clock signal, wherein;

the duration of evaluation window between the rising edge of the first clock signal and the rising edge of the delayed clock signal is a first value when the data signal is in the high state; and the duration of evaluation window between the rising edge of the first clock signal and the rising edge of the delayed clock signal is a second value, different from the first value, when the data signal is in the low state, further wherein;

the first value of the duration of evaluation window between the rising edge of the first clock signal and the rising edge of the delayed clock signal adjustable to be larger than the second value of the duration of evaluation window between the rising edge of the first clock signal and the rising edge of the delayed clock signal.

18. A method for providing a modified high-speed flip-flop circuit comprising:

providing a flip-flop circuit;

providing a first clock signal to the flip-flop circuit;

providing a data signal to the flip-flop circuit, the data signal having a high state and a low state;

providing a delayed clock signal to the flip-flop circuit such that an evaluation window exists between a rising edge of the first clock signal and a rising edge of the delayed clock signal; and providing a self adjusting window circuit coupled to the first clock signal for generating the delayed clock signal such that;

the duration of evaluation window between the rising edge of the first clock signal and the rising edge of the delayed clock signal is a first value when the data signal is in the high state; and the duration of evaluation window between the rising edge of the first clock signal and the rising edge of the delayed clock signal is a second value, different from the first value, when the data signal is in the low state, further wherein;

the first value of the duration of evaluation window between the rising edge of the first clock signal and the rising edge of the delayed clock signal adjustable to be larger than the second value of the duration of evaluation window between the rising edge of the first clock signal and the rising edge of the delayed clock signal.

19. A modified high-speed flip-flop circuit comprising;

a flip-flop circuit;

a first clock signal coupled to the flip-flop circuit;

a data signal coupled to the flip-flop circuit, the data signal having a high state and a low state; and a delayed clock signal coupled to the flip-flop circuit such that an evaluation window exists between a rising edge of the first clock signal and a rising edge of the delayed clock signal, wherein;

the duration of evaluation window between the rising edge of the first clock signal and the rising edge of the delayed clock signal is a first value when the data signal is in the high state; and the duration of evaluation window between the rising edge of the first clock signal and the rising edge of the delayed clock signal is a second value, different from the first value, when the data signal is in the low state, further wherein;

the first value of the duration of evaluation window between the rising edge of the first clock signal and the rising edge of the delayed clock signal adjustable to be larger than the second value of the duration of evaluation window between the rising edge of the first clock signal and the rising edge of the delayed clock signal.

20. A modified high-speed flip-flop circuit comprising:

a flip-flop circuit;

a first clock signal coupled to the flip-flop circuit;

a data signal coupled to the flip-flop circuit, the data signal having a high state and a low state; and a delayed clock signal coupled to the flip-flop circuit such that an evaluation window exists between a rising edge of the first clock signal and a rising edge of the delayed clock signal; and a self adjusting window circuit coupled to the first clock signal for generating the delayed clock signal wherein;

the duration of evaluation window between the rising edge of the first clock signal and the rising edge of the delayed clock signal is a first value when the data signal is in the high state; and the duration of evaluation window between the rising edge of the first clock signal and the rising edge of the delayed clock signal is a second value, different from the first value, when the data signal is in the low state, further wherein;

the first value of the duration of evaluation window between the rising edge of the first clock signal and the rising edge of the delayed clock signal adjustable to be larger than the second value of the duration of evaluation window between the rising edge of the first clock signal and the rising edge of the delayed clock signal.

* * * * *